(12) United States Patent
Meister et al.

(10) Patent No.: US 11,796,444 B2
(45) Date of Patent: Oct. 24, 2023

(54) COUPLING DEVICE FOR AN NMR FLOW CELL

(71) Applicant: Bruker Switzerland AG, Fällanden (CH)

(72) Inventors: Roger Meister, Hinteregg (CH); Martin Woodtli, Mönchaltdorf (CH)

( * ) Notice: Subject to any disclaimer, the term of this patent is extended or adjusted under 35 U.S.C. 154(b) by 0 days.

(21) Appl. No.: 17/895,831

(22) Filed: Aug. 25, 2022

(65) Prior Publication Data
US 2023/0070852 A1 Mar. 9, 2023

(30) Foreign Application Priority Data
Sep. 3, 2021 (DE) .......................... 10202120973.8

(51) Int. Cl.
*G01N 15/14* (2006.01)
*G01N 15/10* (2006.01)

(52) U.S. Cl.
CPC . *G01N 15/1404* (2013.01); *G01N 2015/1006* (2013.01)

(58) Field of Classification Search
CPC ....... G01N 2015/1006; G01N 15/1404; G01R 33/307; G01R 33/302; G01R 33/305
(Continued)

(56) References Cited

U.S. PATENT DOCUMENTS 4,827,761 A * 5/1989 Vinegar ............... G01R 33/307
378/208
6,396,274 B1 5/2002 Commens et al.
(Continued)

FOREIGN PATENT DOCUMENTS

DE 102017120510 B3 12/2018
JP 2003075523 A 3/2003

OTHER PUBLICATIONS

Bruker Fourier 80, https://web.archive.org/web/20210622172925/https://www.bruker.com/de/products-and-solutions/mr/nmr/fourier80.html [Website date: Jun. 22, 2021], retrieved Sep. 14, 2022.
(Continued)

*Primary Examiner* — Jermele M Hollington
*Assistant Examiner* — Courtney G McDonnough
(74) *Attorney, Agent, or Firm* — BENOIT & COTE, INC.

(57) ABSTRACT

A flow cell assembly for use in NMR measurements on a liquid NMR sample in an NMR spectrometer has a cylindrical flow cell for receiving the NMR sample, with a first opening at a first end and a second opening at a second end, and a connecting piece arranged at the first opening for connecting a flow line to the flow cell in a fluid-tight manner. An opening diameter $d_{op}$ of the first opening is smaller than an inner flow cell diameter $d_{in}$, and a sealing head of the connecting piece is arranged in the first opening, with a sealing head diameter $d_{seal}$ larger than $d_{op}$. For NMR measurements, the flow cell assembly is modified in such a way that the flow lines can be easily exchanged, and high-quality NMR flow measurements can be carried out independently of the orientation of the magnetic field in the NMR spectrometer.

14 Claims, 3 Drawing Sheets

(58) Field of Classification Search
USPC .......................................................... 324/307
See application file for complete search history.

(56) References Cited

U.S. PATENT DOCUMENTS

| | | |
|---|---|---|
| 2005/0052184 A1 | 3/2005 | Haner et al. |
| 2006/0091885 A1* | 5/2006 | Rindlisbacher ...... G01R 33/307 |
| | | 324/321 |
| 2016/0290941 A1 | 10/2016 | Hofmann |

OTHER PUBLICATIONS

NMR & EPR Pharma Solutions Insight MR, https://web.archive.org/web/20210624151731/https://www.bruker.com/en/products-and-solutions/mr/nmr-pharma-solutions/InsightMR.html [Website date: Jun. 24, 2021], retrieved Aug. 17, 2022.

Magritek, https://web.archive.org/web/20210613183559/https://magritek.com/applications/reaction-monitoring/ [Website date: Jun. 13, 2021], retrieved Aug. 17, 2022.

* cited by examiner

COUPLING DEVICE FOR AN NMR FLOW CELL

BACKGROUND OF THE INVENTION

Field of the Invention

The invention relates to a flow cell assembly for use in an NMR spectrometer for performing NMR measurements on a liquid NMR sample, the assembly comprising
- a flow cell for receiving the NMR sample, the flow cell forming a first opening at a first end of the flow cell and a second opening at a second end, and the flow cell being substantially cylindrical in shape along a longitudinal axis, and
- a connecting piece for connecting a flow line to the flow cell in a fluid-tight manner, the connecting piece being arranged at the first opening of the flow cell. Such a flow cell assembly is known from US 2006/0091885 A1.

Description of the Related Art

The present invention relates in general to the field of nuclear magnetic resonance ("NMR"), in particular to flow cell assemblies for NMR measurements, through which assemblies a liquid NMR sample is passed during an NMR measurement.

NMR spectroscopy is widely used as a powerful method in instrumental analysis. NMR spectroscopy can be used to examine the electronic environment of individual atoms of a substance to be examined, such as an organometallic compound or a biomolecule, and the interaction of said atoms with neighboring atoms. In so doing, the structure, dynamics and composition of the substance to be examined can be explained and the concentration of the substance to be examined can be determined, for example.

As a rule, the substance to be examined is filled in liquid form into a sample tube which is substantially cylindrical. To perform the measurement, the filled sample tube is placed within the measuring zone of an NMR probe head of an NMR spectrometer. There, the substance is exposed to a strong static magnetic field $B_0$, which aligns the nuclear spins in the substance. High-frequency electromagnetic pulses are then radiated into the substance to be examined. The high-frequency electromagnetic fields generated in this way are detected in the NMR spectrometer. Information about the properties of the examined substance can then be obtained from this.

When measuring liquid sample substances via NMR, the focus can be on different goals. On the one hand, there may be a need to measure many NMR samples successively. Usually, this problem is solved in that the liquid sample substance is filled into an NMR sample tube, this NMR tube is sealed with a stopper or by fusing the opening, and said tube is then introduced into the NMR probe head of the NMR spectrometer. The NMR measurement is then carried out and the NMR tube is then removed from the NMR spectrometer. This procedure is repeated for each additional NMR sample to be measured. It is therefore a relatively time-consuming and labor-intensive measurement process.

On the other hand, it can be of great interest to follow chemical reactions in real time using NMR measurements. However, this is almost impossible to achieve using classic NMR sample tubes. Depending on the substances used, chemical reactions can be completed within a few milliseconds or can last several hours. In the case of short-term reactions, the experimenter often has no chance of filling the substances into the NMR sample tube, sealing it, inserting it into the NMR spectrometer and starting an NMR measurement quickly enough in order to track the reaction in real time. In the case of very slow reactions, on the other hand, it is often necessary to ensure good and permanent mixing of the different substances, so that the chemical reaction can proceed reasonably uniformly and reproducibly.

One way to achieve the above goals is to use a so-called flow cell as an NMR sample container. This is inserted into the NMR probe head of the NMR spectrometer and contains feed lines by means of which a liquid NMR sample can be fed in and removed again. Such flow cells have already been described in the technical literature.

For example, US 2016/0290941 A1 describes a monitoring cell by means of which an NMR measurement of a reaction liquid can be carried out. The monitoring cell includes a hollow NMR probe that is filled with an NMR sample to be measured and is open at only one end. The hollow NMR probe is connected to the rest of the monitoring cell at the open end via an adapter and can be replaced if necessary. A capillary for supplying the liquid sample protrudes into the hollow NMR probe. The liquid sample is fed in and removed from the open side. If the monitoring cell is inserted into an NMR spectrometer in which the magnetic field in the measuring zone is parallel to the capillary of the hollow NMR probe of the monitoring cell, the NMR measurements are not disturbed. In the case of NMR spectrometers in which the magnetic field in the measuring zone is not parallel but, for example, perpendicular to the capillary of the hollow NMR probe of the monitoring cell, the capillary interferes. The disturbance comes about because the capillary shifts or bends the homogeneous and parallel magnetic field in the region in which the capillary passes through the magnetic field. The influence of the capillary on the magnetic field cannot be adequately compensated for by shimming, which results in an NMR measurement being possible but the results being absolutely useless and uninterpretable. The monitoring cell described in US 2016/0290941 A1 can therefore only be used in NMR spectrometers in which the magnetic field runs parallel to the capillary of the hollow NMR probe.

Furthermore, US 2005/0052184 A1 describes an NMR flow cell structure which comprises a flow cell, an inlet line and an outlet line. The inlet line and outlet line are located at an upper end and at a lower end of the flow cell, respectively, and are each connected to the flow cell via a connecting piece. To do this, the ends of the flow cell, the inlet line and the outlet line are pushed into the connecting piece and fastened by adhesive bonding. The liquid NMR sample flows through the flow cell in only one direction. A disadvantage of this flow cell design is that, because of the firm adhesive bonding, the flow cell cannot be easily replaced, for example if it is damaged or contaminated. The adhesively bonded inlet and outlet lines must be replaced as well. This makes it more difficult or even impossible to reuse the flow cell structure.

An NMR probe head is presented in U.S. Pat. No. 6,396,274 B1, which is suitable both for measurements using a simple NMR sample tube and for measurements using a flow cell. Also described are connections by means of which a liquid sample substance is guided from a lower end of a flow cell inserted into the NMR probe head to an upper end of the flow cell. The reference does not describe in detail how the flow cell with the connections is configured.

In the flow cell assemblies "InsightMR" of Bruker Corporation, Billerica, Mass., USA and Insight 2.0 of Bruker Corporation, Billerica, Mass., USA, the liquid NMR sample is conveyed into an NMR sample tube by means of a capillary which protrudes into the NMR sample tube. The NMR sample tubes are closed on one side, which is why the sample substance is discharged on the same side as it was introduced. Difficulties similar to those already described with regard to US 2016/0290941 A1 arise here. The flow cell assemblies can only be used in NMR spectrometers in which the magnetic field is parallel to the capillary of the hollow NMR probe.

A flow cell assembly from the company Magritek GmbH, Aachen, North Rhine-Westphalia, Del. has also become known. This flow cell assembly includes a flow cell that has a capillary inserted into one end. The capillary is inserted into a narrowed portion of the flow cell. The flow cell and capillary are connected by a purely frictional connection. The liquid NMR sample flows through the flow cell in only one direction. However, the problem with this flow cell assembly is that the connection is only inserted and is held in position solely by frictional force. Therefore, at higher pressures (usually beginning at 2 bar) in the flow cell, the seal of the flow cell assembly can suffer and, in extreme cases at high pressures in the flow cell, the connection can become completely loose.

US 2006/0091885 A1 discloses a way of constructing a flow cell assembly for use in an NMR spectrometer for NMR measurements, with the liquid NMR sample flowing through a flow cell only once, from one end of the flow cell to the other end of the flow cell. There is no capillary for supplying or removing the liquid sample substance in the measuring zone of the flow cell. The flow cell assembly includes a flow cell and a connecting piece at each end of the flow cell. An inlet capillary and an outlet capillary for the liquid sample substance can be connected to the flow cell via the connecting pieces. There are grooves at each end of the flow cell, over which grooves a retaining ring and an expandable end of the connecting piece are pushed, whereby the connecting piece is firmly connected to the particular end of the flow cell. Then, an inlet capillary or an outlet capillary, each of which comprises a connecting piece with a tapered portion and a compression spring, is inserted into the corresponding connecting piece, fixed and in this way connected to the flow cell.

A disadvantage of this known flow cell assembly is that the material of the expandable end of the connecting piece shows signs of fatigue and, in the worst case, can break if it is used frequently and over a longer period of time. The same applies to the connector of the inlet capillary or the outlet capillary. With frequent use, the material of the compression spring can show signs of fatigue and, in the worst case, can fail. There is also a risk that the connector can become detached from the connecting piece when measuring at high pressures in the flow cell.

SUMMARY OF THE INVENTION

The present invention is based on modifying a generic flow cell assembly of the type described above for an NMR measurement of a liquid NMR sample using the simplest possible technical means such that the flow lines can be easily replaced. Using this modified flow cell assembly, it should then be possible to carry out high-quality NMR flow measurements that are independent of the orientation of the magnetic field in an NMR spectrometer.

This is achieved by the present invention in a way that is as surprisingly simple as it is effective, in that an opening diameter $d_{op}$ of the first opening of the flow cell is smaller than an inner flow cell diameter $d_{in}$, and in that a sealing head of the connecting piece is arranged in the first opening of the flow cell, a sealing head diameter $d_{seal}$ of the sealing head of the connecting piece being larger than the opening diameter $d_{op}$ of the first opening of the flow cell.

The present invention proposes making the opening diameter $d_{op}$ of the first opening of the flow cell smaller than the inner flow cell diameter $d_{in}$. The flow cell tapers towards the first opening. Typically, the opening diameter $d_{op}$ is: $d_{op}=0.9*d_{in}$, preferably $d_{op}=0.8*d_{in}$, particularly preferably $d_{op}=0.7*d_{in}$. Then, the connecting piece having the sealing head, which has the sealing head diameter $d_{seal}$, is inserted into the flow cell. The sealing head is positioned within the flow cell, while the remaining portion of the connection head may be outside the flow cell.

Since the sealing head diameter $d_{seal}$ of the sealing head is larger than the opening diameter $d_{op}$ of the first opening of the flow cell, the sealing head and thus also the connecting piece can be held in position in a simple and effective manner by means of the taper at the first opening of the flow cell. By blocking the relative movement of the flow cell and connecting piece in any direction other than the direction of insertion of the connecting piece, which blocking is achieved in this way, a positive fit is created. With the help of the positive fit, the connecting piece can be held in a stable position and secured against slipping in the flow cell and against slipping out of the flow cell.

The second opening at the second end of the flow cell must be large enough to allow the connecting piece to be inserted into the flow cell through the second opening. After the connecting piece has been inserted, the second opening can be connected, for example to a connection by means of which a liquid NMR sample can be removed from the flow cell again.

The flow cell is substantially hollow-cylindrical along a longitudinal axis. The hollow-cylindrical design of the flow cell enables good flow of the liquid NMR sample through the flow cell while maintaining a stable structure of the cell at the same time.

The connecting piece has an inner line. By means of the connecting piece, a flow line (e.g., a capillary) can be connected to the flow cell via the inner line in a simple manner (e.g., by inserting the flow line into the connecting piece), for example by means of a screw ring which is screwed onto the connecting piece, as a result of which the flow line is fixed to the connecting piece. A permanently fixed connection between the flow line and flow cell is not necessary. During an NMR measurement, the liquid NMR sample to be examined can be fed into the flow cell through the flow line via the connecting piece at the first opening of the flow cell. The liquid NMR sample flows through the flow cell and can be discharged at the second opening of the flow cell (for example into a reaction vessel or a disposal vessel). After the end of the measurement, the flow line can just as easily be disconnected from the connecting piece and another flow line can be connected, for example to carry out another measurement with a different liquid NMR sample or to clean the flow cell with the help of a solvent.

As already mentioned above, the liquid NMR sample is introduced into the flow cell at the first opening of the flow cell and removed again at the second opening of the flow cell. The liquid NMR sample flows through the flow cell in one direction only. With this design of the flow cell assembly, there is no need to extend the flow line very far into the flow cell to ensure good mixing and consistent flow of the liquid NMR sample. In the measurement zone of an NMR spectrometer, the flow cell only contains the liquid NMR sample and no inlet or outflow lines. This means that NMR measurements can also be carried out on NMR spectrometers in which the magnetic field in the measurement zone is not necessarily parallel to the longitudinal axis of the flow cell.

The positive fit between the connecting piece and the flow cell also enables good resistance against the pressure exerted on the connecting piece by the inflowing liquid NMR sample. Due to the positive fit, a spatial slippage of the connecting piece caused by high pressure can be avoided. Furthermore, the positive fit between the connecting piece and the flow cell can prevent leaks at high pressures, such that the liquid NMR sample emerges on the side of the first opening of the flow cell.

The walls of the flow cell are typically made of borosilicate glass 3.3. The connecting piece is typically made of PCTFE (polychlorotrifluoroethylene).

In very particularly preferred embodiments of the flow cell assembly according to the invention, an outer contour of the sealing head is substantially the same as an inner contour of the flow cell in the region of the first opening. In this way, a precise positive fit can be achieved between the sealing head and the flow cell. The sealing head and thus the connecting piece can be held in position even more stably and the connecting piece can be prevented from slipping. In addition, the connecting piece can also be used at high pressures. The likelihood of leakage between the sealing head and the flow cell can also be reduced. The outer contour and the inner contour can, for example, be semicircular or in the shape of a truncated cone.

A preferred class of embodiments of the flow cell assembly according to the invention is characterized in that the sealing head has at least one sealing element, preferably at least two sealing elements, in particular at least three sealing elements, along the longitudinal axis of the flow cell, the sealing elements being arranged between an inner wall of the flow cell and an outer wall of the sealing head.

The at least one sealing element means that the sealing between the sealing head and the flow cell can be further improved and the flow cell assembly can be operated at even higher pressures without any problems. Furthermore, the at least one sealing element can additionally stabilize the position of the sealing head in the flow cell, since the sealing element ensures additional clamping of the sealing head and flow cell by means of the pressure it exerts on the inner wall of the flow cell and on the outer wall of the sealing head.

In preferred developments of this class of embodiments, at least one sealing element is designed as a profile seal or contour seal.

In practice, this can be implemented particularly easily and cost-effectively, while providing a sufficiently good sealing effect at the same time.

Also preferred are developments of this class of embodiments of the flow cell assembly according to the invention which are characterized in that the sealing head has at least one annular peripheral groove in a region of the sealing element, in which groove a sealing ring can be accommodated.

A defined mechanical guide for the sealing element is provided by the groove. The sealing ring can simply be inserted into the annular peripheral groove and then remains in the groove. In this way, the insertion of the connecting piece with the sealing head into the flow cell can be further simplified, since the sealing ring is held by the groove and cannot be pushed out of its position when being inserted into the flow cell.

Further developments of this class of embodiments which are also preferred are those in which at least one sealing element has an elastic or liquid sealing material.

This is particularly easy and inexpensive to implement in practice. The elastic or liquid sealing material can be distributed evenly between the sealing head and the flow cell. Furthermore, it is possible to permanently connect the connecting piece to the flow cell.

Further preferred embodiments of the flow cell assembly according to the invention are characterized in that a connection diameter $d_{con}$ of the sealing head of the connecting piece is larger than an outer diameter $d_{out}$ of a sealing neck of the connecting piece.

This allows the connecting piece to be easily fitted into the flow cell and the sealing neck to be passed through the first opening of the flow cell. For the diameters of the flow cell assembly, in general the following applies: $d_{in} \geq d_{seal} > d_{op} > d_{con} > d_{out}$.

Also preferred are embodiments of the flow cell assembly according to the invention in which the outside diameter $d_{out}$ of the sealing neck of the connecting piece is smaller than a flow cell outside diameter $d_{fout}$ of the flow cell. In this way, the flow cell assembly can also be introduced into an NMR probe head that has an opening narrowed on one side. For $d_{out}$, it typically applies that $d_{out} \leq 0.9 \cdot d_{fout}$, preferably $d_{out} \leq 0.75 \cdot d_{fout}$, particularly preferably $d_{out} \leq 0.6 \cdot d_{fout}$.

Equally preferred are embodiments of the flow cell assembly according to the invention in which, in a region outside the flow cell, the connecting piece has an opening having a receiving diameter $d_{rec}$ for receiving a flow line.

A flow line can be inserted into the opening having the receiving diameter $d_{rec}$. Typically, the receiving diameter $d_{rec}$ is approximately equal to the outer diameter of the flow line, so that the flow line can be inserted precisely into the opening and thus no liquid NMR sample can escape from the opening. The receiving diameter $d_{rec}$ can be adjusted so that flow lines of different sizes can be connected to the connecting piece. Typically, the receiving diameter $d_{rec}$ is approximately half the outer diameter of the sealing neck, in order to ensure good stability of the connecting piece.

In further, very particularly preferred classes of embodiments of the flow cell assembly according to the invention, in a region within the flow cell, the sealing head of the connecting piece has an opening having a transfer diameter $d_{tran}$ for transferring the liquid NMR sample.

The transfer diameter $d_{tran}$ can be flexibly adjusted. Typically, the transfer diameter $d_{tran}$ can be $d_{tran} \approx 0.2 \cdot d_{in}$.

Also preferred are further developments of this class of embodiments which are characterized in that the following applies to the receiving diameter $d_{rec}$ and the transfer diameter $d_{tran}$: $d_{tran} < d_{rec}$. This allows a fixed stop to be defined when introducing a flow line.

Also preferred are embodiments of the flow cell assembly according to the invention in which an inner line diameter did of a connecting line in the sealing head of the connecting piece is larger than an outer line diameter $d_{old}$ of the connecting line.

The connecting line includes a region having an inner line diameter did and an outer line diameter $d_{old}$. The outer line diameter $d_{old}$ is approximately matched to the diameter of the flow line. Due to the larger inner line diameter $d_{lid}$, the liquid NMR sample can be better introduced into the flow cell and a uniform flow of liquid sample substance can be made available. In addition, a stepped reduction in the flow rate of the liquid NMR sample can be achieved in the transition from a flow line to the interior of the flow cell.

Also preferred are embodiments of the flow cell assembly according to the invention which are characterized in that the flow cell assembly is designed for an internal pressure of at least 10 bar, preferably at least 15 bar, in particular at least 20 bar.

With a flow cell designed for these pressures, the liquid NMR sample can be transported quickly through the flow cell. The quality of NMR measurements can also be improved as a result of the flow of the liquid sample substance being constant. High pressures in particular are required for rapid reactions to be monitored using NMR measurements, since this is the only way that the liquid NMR sample can be conveyed quickly from the reaction vessel to the region of NMR measurement in the NMR spectrometer.

Also within the scope of the present invention is an NMR spectrometer for measuring NMR samples, comprising
a flow cell assembly as described above,
a magnet bore in an NMR magnet arrangement, and
a sample holder within the magnet bore for reversible insertion of the flow cell assembly.

The numerous advantages of the flow cell assembly according to the invention are particularly effective in practice in such a design of an NMR spectrometer.

A preferred class of embodiments of the NMR spectrometer according to the invention is characterized in that an NMR magnetic field generated by the NMR magnet arrangement runs transversely, in particular perpendicularly, to an axis of the magnet bore.

Since a flow line that disturbs the NMR magnetic field is not arranged in the flow cell, good quality measurements can also be obtained in this case.

Further advantages of the invention will become apparent from the description and the drawings. Likewise, the features according to the invention that are mentioned above and set out in the following can each be used individually per se or together in any desired combinations. The embodiments shown and described are not to be understood as an exhaustive list but instead are of an exemplary nature for describing the invention.

BRIEF DESCRIPTION OF THE DRAWINGS

The invention is illustrated in the drawings and will be explained in more detail with reference to embodiments. In the drawings.

DETAILED DESCRIPTION

Figure 1:
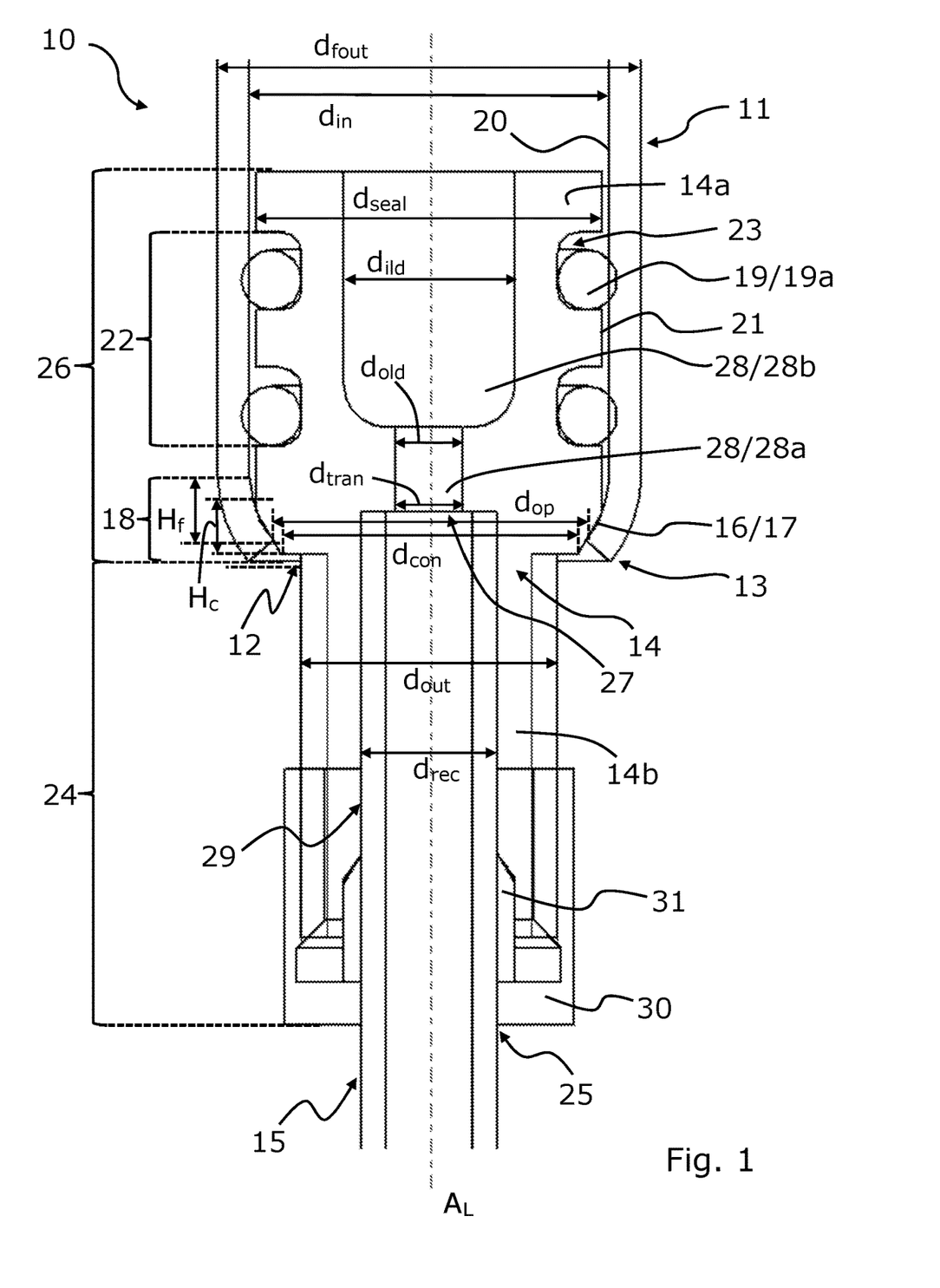
FIG. 1 shows a detail of a schematic longitudinal section of a flow cell assembly according to the invention with a partially shown flow cell and a connecting piece.

FIG. 1 shows a schematic longitudinal section of a portion of a flow cell assembly 10 according to the invention as can be used in an NMR spectrometer for NMR measurement of a liquid NMR sample. The flow cell assembly 10 extends along a longitudinal axis $A_L$.

The flow cell assembly 10 includes a flow cell 11 ("sample tube") in which the liquid NMR sample is received. The flow cell 11 is substantially cylindrical and has a flow cell outer diameter $d_{fout}$ of approximately 5 mm, an inner flow cell diameter $d_{in}$ of approximately 4 mm and a total length along the longitudinal axis $A_L$ of approximately 180 mm (in FIG. 1 only a lower portion of the flow cell 11 of approximately 10 mm length is shown). In the embodiment shown here, the flow cell 11 is made of borosilicate glass 3.3.

A first opening 12 having an opening diameter $d_{op}$ of approximately 3.5 mm (i.e., approximately 87% of the inner flow cell diameter $d_{in}$) is formed at a first end 13 of the flow cell 11 and a second opening is formed at a second end of the flow cell 11 (not shown in detail). The inner flow cell diameter $d_{in}$ tapers to the opening diameter $d_{op}$ along the longitudinal axis $A_L$ over a height $H_c$ of approximately 0.7 mm (i.e., somewhat less than 0.5% of the total length of the flow cell 11).

With regard to the first opening 12 at the first end 13 and the second opening at the second end, the flow cell 11 is not symmetrical in the embodiment shown. This means that the first opening 12 and the second opening are not identical in shape. In the embodiment shown here, the second opening at the second end of the flow cell 11 is designed without tapering (not shown in more detail). In other embodiments not shown here, it is also possible for the second opening at the second end of the flow cell 11 to widen.

The flow cell assembly 10 further includes a connecting piece 14 arranged at the first opening 12 at the first end 13 of the flow cell 11. The connecting piece 14 is divided into a sealing head 14a (also referred to as a "spigot" or "coupling") and a sealing neck 14b. A sealing head diameter $d_{seal}$ of the sealing head 14a is approximately 3.9 mm and is therefore minimally smaller than the inner flow cell diameter $d_{in}$ (=4 mm) of the flow cell 11. An outer diameter $d_{out}$ of the sealing neck 14b is approximately 2.75 mm and is therefore smaller than the opening diameter $d_{op}$ (=3.5 mm) of the flow cell 11. The sealing head 14a, which has the sealing head diameter $d_{seal}$ of 3.9 mm, tapers at the transition to the sealing neck 14b, over a height $H_c$ of the connecting piece 14 of approximately 0.6 mm, to a connection diameter $d_{con}$ of approximately 3.4 mm.

In the embodiment shown here, $d_{in}$ (=4 mm)≥$d_{seal}$ (=3.9 mm)>$d_{op}$ (=3.5 mm)>$d_{con}$ (=3.4 mm)>$d_{out}$ (=2.75 mm). This enables the connecting piece 14 to be inserted securely, and the flow cell 11 and the connecting piece 14 form a tight positive fit.

The connecting piece 14 is inserted into the flow cell 11 in order to produce the flow cell assembly 10. This is possible because the outer diameter $d_{out}$ of the sealing neck 14b of 2.75 mm is smaller, and the sealing head diameter $d_{seal}$ of the sealing head 14a of 3.9 mm is slightly smaller than the inner flow cell diameter $d_{in}$ of the flow cell 11 of 4 mm. The first opening 12 having the opening diameter $d_{op}$ of 3.5 mm is large enough that the sealing neck 14b having the outer diameter $d_{out}$ of 2.75 mm can be guided out of the flow cell 11 while the sealing head 14a remains inside the flow cell 11 and forms a positive fit with the flow cell 11. The connection diameter $d_{con}$ of the sealing head 14a of 3.4 mm is slightly smaller than the opening diameter $d_{op}$ (=3.5 mm) of the first opening 12 at the first end 13 of the flow cell 11. Therefore, the sealing head 14a cannot be pushed beyond the first opening 12 of the flow cell 11 since the sealing head diameter $d_{seal}$ is larger than the opening diameter $d_{op}$ of the first opening 12.

In the embodiment shown here, the connecting piece 14 has a length of approximately 10 mm along the longitudinal axis $A_L$. The sealing head 14a occupies a region 26 within the flow cell 11, the length of the sealing head 14a along the longitudinal axis being approximately 4.5 mm. The sealing neck 14b occupies a region 24 external to the flow cell 11, the length of the sealing neck 14b along the longitudinal axis being approximately 5.5 mm.

In a region 18 of the first opening 12, there is both the tapering of the flow cell 11 and the tapering of the sealing head 14a. In the embodiment shown here, an outer contour 16 of the sealing head 14a is designed in such a way that it substantially corresponds to an inner contour 17 of the flow cell 11. In this way, a particularly stable positive fit is achieved and the seal between the flow cell 11 and the connecting piece 14 is improved.

The sealing head 14a comprises two sealing elements 19. In the embodiment shown here, the sealing elements 19 are designed in the form of two sealing rings 19a. The sealing rings 19a are arranged along the longitudinal axis $A_L$ between an inner wall 20 of the flow cell and an outer wall 21 of the sealing head 14a and embedded in an annular peripheral groove 23. As a result of the groove 23, the sealing rings 19a can be securely attached to the sealing head 14a. The groove 23 extends over a region 22 which comprises approximately the central region along the longitudinal axis $A_L$ in the sealing head 14a. In further embodiments not shown here, it is also possible for only one sealing element 19 or for three sealing elements 19 to be present. The sealing elements 19 improve the seal between the flow cell 11 and the connecting piece 14 and also ensure that the sealing head 14a is additionally clamped within the flow cell 11.

Furthermore, the sealing head 14a comprises a connecting line 28 having an outer line 28a and an inner line 28b. In the embodiment shown here, the connecting line 28 is substantially cylindrical and has a length of approximately 4 mm along the longitudinal axis $A_L$. The outer line 28a has an outer line diameter $d_{old}$ of approximately 0.8 mm and a length along the longitudinal axis $A_L$ of approximately 1 mm. The inner line 28b has an inner line diameter did of approximately 2 mm and a length along the longitudinal axis $A_L$ of approximately 3 mm.

A liquid NMR sample is conducted, via the outer line 28a, from the first opening 12 further into the inner line 28b and from there into the flow cell 11. The liquid NMR sample flows through the flow cell 11 in a uniform flow due to the larger inner line diameter did of the connecting line 28. The rounded contour widening at the transition from the outer line 28a to the inner line 28b also ensures a uniform flow of the liquid NMR sample out of or into the flow cell 11.

The sealing neck 14b of the connecting piece 14 comprises an opening 25 having a receiving space 29 for receiving a flow line 15 (also referred to as a "capillary", "inlet capillary" or "inlet line"), and also comprises a sleeve 30 having a clamping ring 31. The opening 25 is formed outside the flow cell 11 and has a receiving diameter $d_{rec}$ of approximately 1.6 mm in the embodiment shown here. The receiving space has a length of approximately 6 mm along the longitudinal axis $A_L$.

The flow line 15, the diameter of which is minimally smaller than the receiving diameter $d_{rec}$, is inserted completely into the receiving space 29 in the embodiment shown here. The flow line 15 is clamped in the receiving space via the sleeve 30 together with the clamping ring 31 and can thus be held in a stable position. In this way, a fluid-tight connection of the flow line 15 to the flow cell 11 via the connecting piece 14 is achieved. Since the flow line is only clamped, it can be easily removed from the connecting piece 14.

In the embodiment shown here, the sealing head 14a has an opening 27 through which the liquid NMR sample is conducted from the flow line 15 further into the flow cell 11. The opening 27 is located in the region 26 of the flow cell and the opening 26 has a transfer diameter $d_{tran}$ of approximately 0.8 mm. At the same time, the outer line 28a of the connecting line 28 is accessible via the opening 27. In the embodiment shown here, the transfer diameter $d_{tran}$ of the opening 27 is substantially equal to the outer line diameter $d_{old}$ (=0.8 mm) of the connecting line 28. In the embodiment shown here, an inner diameter of the flow line 15 is substantially equal to the transfer diameter $d_{tran}$.

In the embodiment shown here, the flow line 15 is made of quartz glass, i.e., a rigid material. Furthermore, it is possible for the flow line 15 to be made entirely of a flexible material such as silicone, or for the flow line 15 to be made of a rigid material in the region of the connecting piece 14 and for the rest of the flow line 15 to be made of a flexible material.

Figure 2:
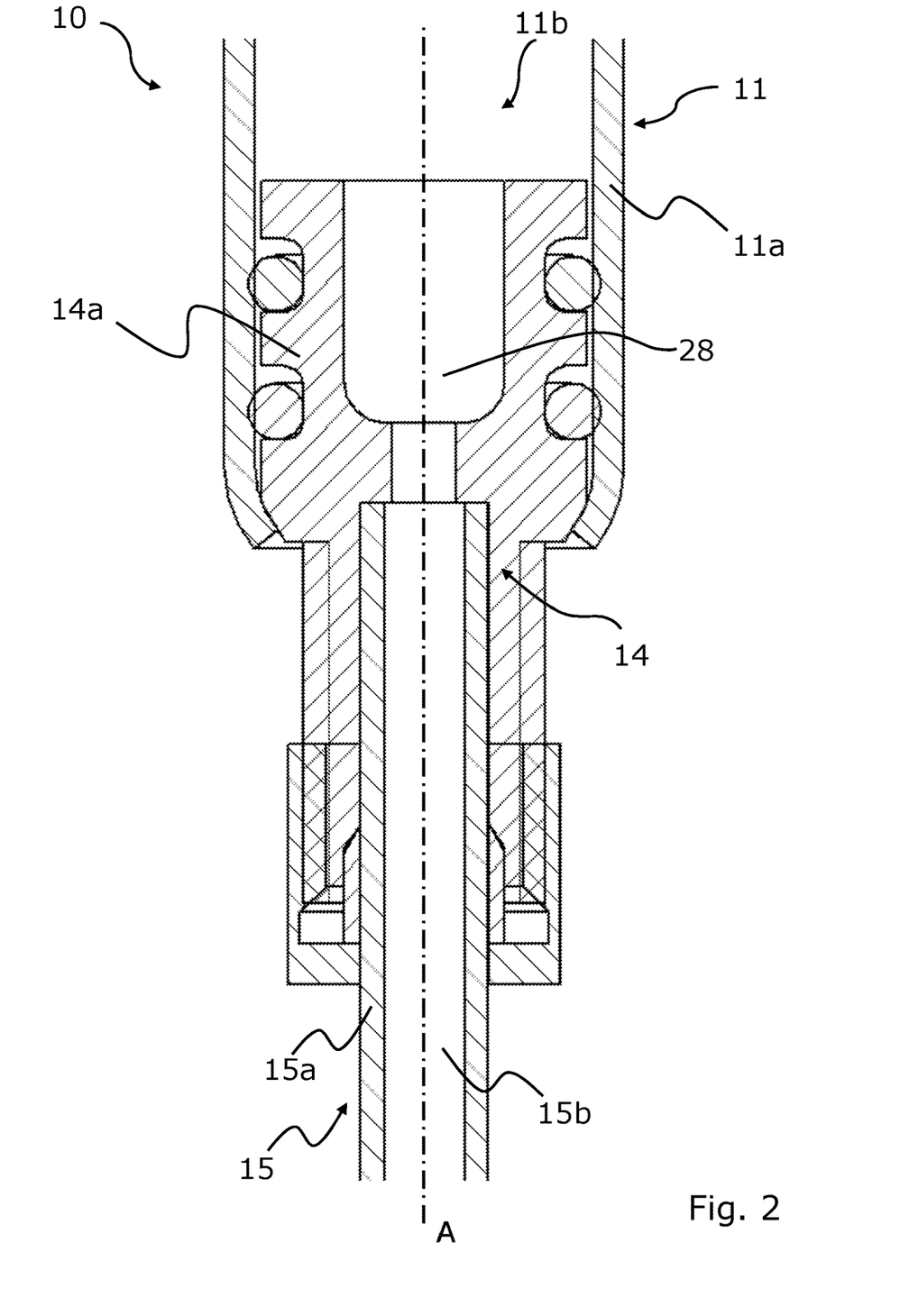
FIG. 2 shows the schematic longitudinal section of the flow cell assembly according to the invention from FIG. 1 with and without hatching to illustrate the flow spaces for a liquid NMR sample.

FIG. 2 shows the schematic longitudinal section of the flow cell assembly 10 according to the invention from FIG. 1 with and without hatching to illustrate the flow spaces for a liquid NMR sample.

The flow cell 11 comprises a flow cell wall 11a (hatched area), which delimits an unfilled flow cell interior 11b (unhatched area) from its surroundings. In the embodiment shown here, the sealing head 14a of the connecting piece 14 is arranged in the flow cell interior 11b. The liquid NMR sample can be conducted in the remaining flow cell space.

The connecting piece 14 (hatched area) includes the connecting line 28, which is unfilled in the form shown here (unhatched area). In the embodiment shown here, the connecting line 28 is connected to the flow line 15. The flow line 15 comprises a line wall 15a (hatched area) which delimits an unfilled line interior 15b (unhatched area) from the surroundings and the connecting piece 14.

In an NMR measurement, the liquid NMR sample is conducted via the line interior 15b of the flow line 15 to the connecting line 28 of the connecting piece 14 and from there further into the flow cell interior 11b of the flow cell 11. The liquid NMR sample is then removed from the flow cell interior 11b at the second opening at the second end of the flow cell 11 (not shown in detail). However, the direction of flow can also run in the opposite direction from the second opening to the first opening 12 and then through the connecting piece 14 into a flow line 15.

Figure 3:
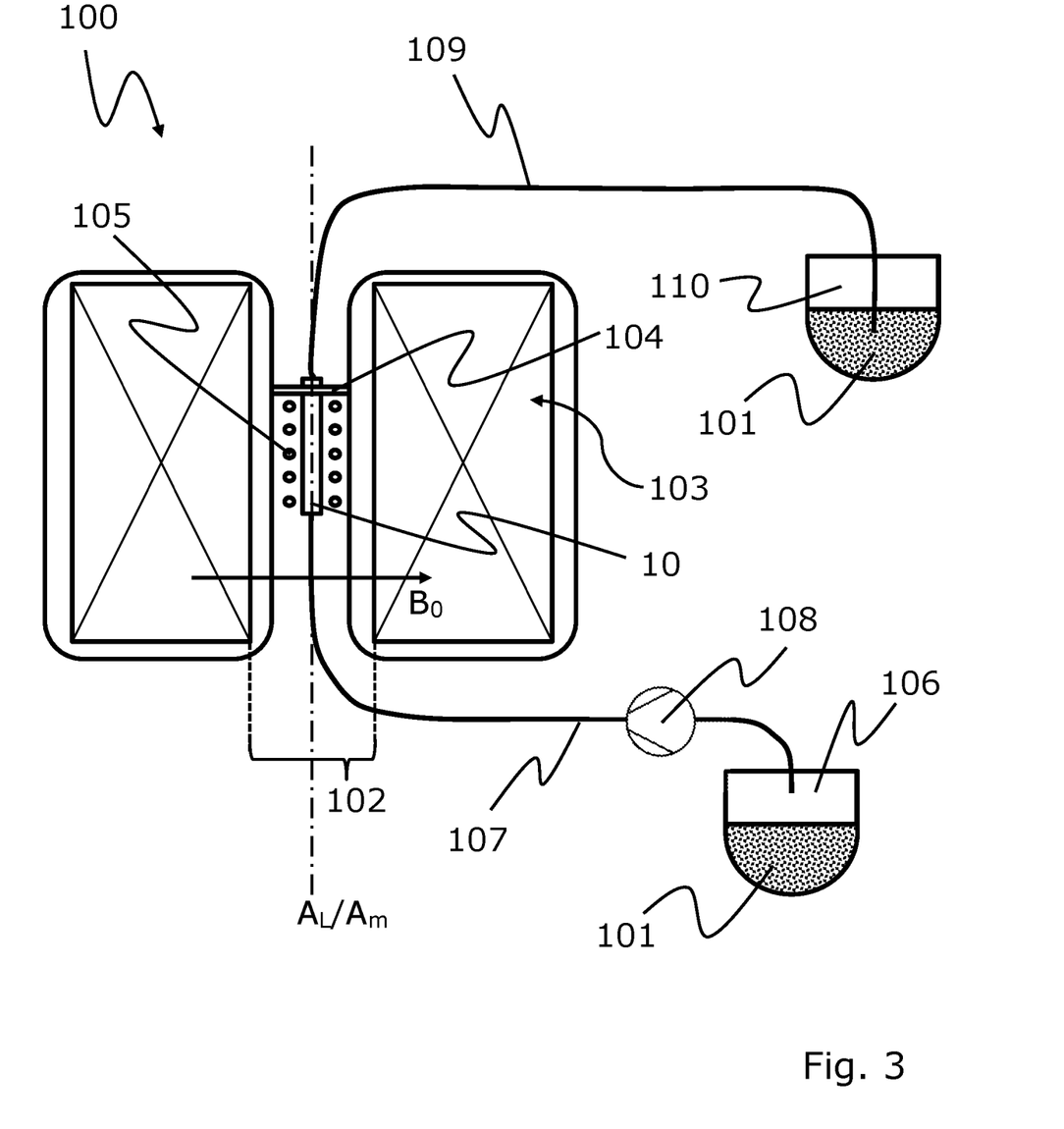
FIG. 3 is a schematic view of a measurement setup for carrying out an NMR measurement using an NMR spectrometer and the flow cell assembly according to the invention.

FIG. 3 is a schematic view of a measurement setup for carrying out an NMR measurement of a liquid NMR sample 101 using an NMR spectrometer 100 and the flow cell assembly 10 according to the invention.

The NMR spectrometer 100 includes an NMR magnet arrangement 103 having a magnet bore 102, a sample holder 104, and an RF (=radio frequency) coil 105 for the excitation and detection of an NMR signal of the liquid NMR sample 101 and includes the flow cell assembly 10 according to the invention which is inserted into the sample holder 104 of the NMR spectrometer 100. The flow cell assembly 10 extends along the longitudinal axis $A_L$ and the magnet bore 102 extends along an axis $A_m$; in the embodiment shown here, the longitudinal axis $A_L$ and the axis $A_m$ of the magnet bore 102 are substantially identical. In the embodiment shown here, an NMR magnetic field $B_0$ is perpendicular to the longitudinal axis $A_L$. However, in further embodiments not shown here, it is also possible for the NMR magnetic field $B_0$ to be parallel to the longitudinal axis $A_L$, for example.

The flow cell assembly 10 is connected to a first reservoir 106 via an inlet line 107, the inlet line 107 being connected to flow cell assembly 10 via the connecting piece. A pump 108 is connected to the inlet line 107. The flow cell assembly 10 is connected to a second reservoir 110 via an outflow line 109.

The liquid NMR sample 101 to be measured is located in the first reservoir 106. The liquid NMR sample 101 is fed to the flow cell assembly 10 via the inlet line 107 with the aid of the pump 108. From there, the liquid NMR sample is then fed into the second reservoir 110 via the outflow line 109.

Measurement of NMR Samples

The measurement of the NMR sample 101 using the NMR spectrometer 100 and the flow cell assembly 10 can be done in the following way:

The flow cell assembly 10 is assembled by inserting the connecting piece with the components described in FIG. 1 into the flow cell. The connecting piece and the flow cell form a positive fit at the first opening. The flow line, which is designed here as an inlet line 107, is connected to the connecting piece in a fluid-tight manner, it being possible for the liquid NMR sample 101 to be fed in via the inlet line 107. The outlet line 109 is attached to the second end of the flow cell.

The flow cell assembly 10 is inserted into the NMR spectrometer 100 that has the magnet bore 102 which comprises the sample holder 104 for the flow cell assembly 10. The magnet bore 102 is in turn arranged in an NMR magnet arrangement 103. Since the flow cell assembly 10, in a measuring zone of the flow cell 11, does not have any other components such as a flow line which could disrupt a magnetic field, it is substantially irrelevant in which direction the NMR magnetic field $B_0$ generated by the NMR magnet arrangement 103 points. This means that the invention can be used both in NMR spectrometers 100 in which the magnetic field $B_0$ is parallel to the magnet bore 102 (and thus parallel to the longitudinal axis $A_L$ of the flow cell) and in NMR spectrometers 100 in which the magnetic field $B_0$ runs transversely to the magnet bore 102 (and thus transversely to the longitudinal axis $A_L$ of the flow cell).

After the flow cell assembly 10 is placed in the NMR spectrometer 100, the NMR measurement is started. The NMR measurement can be a single measurement or a continuous measurement, for example to follow a chemical reaction in real time.

During the NMR measurement, the liquid NMR sample 101 is conveyed from the first reservoir 106, with the aid of the pump 108, via the inlet line 107 to the connecting line. From the connecting line, the liquid NMR sample 101 flows into the flow cell and from there flows along the longitudinal axis $A_L$ to the outflow line 109 at the first opening of the flow cell. In the embodiment shown here, the liquid NMR sample 101 flows once through the flow cell in one direction. The liquid NMR sample 101 is then conducted from the flow cell into the second reservoir 110 via the outflow line 109.

After the NMR measurement is completed, the flow cell assembly 10 is removed from the sample holder 104 of the NMR spectrometer 100. The inlet line 107 is then removed from the connecting piece and the outflow line 108 is removed from the second end of the flow cell. The flow cell assembly 10 can then be cleaned, disassembled, or used for another NMR measurement.

The flow cell assembly 10 easily withstands pressures of up to 20 bar caused by the inflowing liquid NMR sample. At the same time, a good seal between the flow cell and the connecting piece is achieved, so that no liquid NMR sample 101 escapes from the flow cell assembly 10, thereby rendering the NMR measurement unusable or causing the NMR spectrometer 100 to be contaminated or damaged by the liquid NMR sample 101.

LIST OF REFERENCE SIGNS 10 flow cell assembly
11 flow cell
11a flow cell wall
12b flow cell interior
12 first opening
13 first end
14 connecting piece
14a sealing head
14b sealing neck
15 flow line
15a line wall
15b line interior
16 outer contour
17 inner contour
18 region (of the first opening)
19 sealing element
19a sealing ring
20 inner wall
21 outer wall
22 region (of the sealing element)
23 annular peripheral groove
24 region (outside the flow cell)
25 opening (with receiving diameter $d_{rec}$)
26 region (inside the flow cell)
27 opening (having transfer diameter $d_{tran}$)
28 connecting line
28a outer line
28b inner line
29 receiving space
30 sleeve
31 clamping ring
100 NMR spectrometer
101 (liquid) NMR sample
102 magnet bore
103 NMR magnet assembly
104 sample holder
105 RF coil
106 first reservoir (for inflow)
107 inlet line
108 pump
109 outflow line
110 second reservoir (for outflow)
$A_L$ longitudinal axis
$A_m$ axis (of magnet bore)
$B_0$ NMR magnetic field
$d_{old}$ outer line diameter
$d_{con}$ connection diameter
$d_{rec}$ receiving diameter
$d_{out}$ outer diameter
$d_{seal}$ sealing head diameter
$d_{fout}$ flow cell outer diameter
$d_{lid}$ inner line diameter
$d_{in}$ inner flow cell diameter
$d_{op}$ opening diameter
$d_{tran}$ transfer diameter
$H_c$ height (of the taper of the connecting piece)
$H_f$ height (of the first opening)

The invention claimed is:

1. A flow cell assembly for use in an NMR spectrometer for performing NMR measurements on a liquid NMR sample, the assembly comprising:
   a flow cell for receiving the NMR sample, the flow cell forming a first opening at a first end of the flow cell and a second opening at a second end of the flow cell, and being substantially hollow-cylindrical along a longitudinal axis ($A_L$); and
   a connecting piece for connecting a flow line to the flow cell in a fluid-tight manner, the connecting piece being arranged at the first opening of the flow cell,
   wherein an opening diameter $d_{op}$ of the first opening of the flow cell is smaller than an inner flow cell diameter $d_{in}$, and
   a sealing head of the connecting piece is arranged in the first opening of the flow cell, and a sealing head diameter $d_{seal}$ of the sealing head of the connecting piece is larger than the opening diameter $d_{op}$ of the first opening of the flow cell, the flow cell and the sealing head each being tapered in a region of the first opening such that an outer contour of the sealing head substantially corresponds to an inner contour of the flow cell.

2. The flow cell assembly according to claim 1, wherein the sealing head has at least one sealing element along the longitudinal axis ($A_L$) of the flow cell, the at least one sealing element being arranged between an inner wall of the flow cell and an outer wall of the sealing head.

3. The flow cell assembly according to claim 2, wherein the at least one sealing element is configured as a profile seal or contour seal.

4. The flow cell assembly according to claim 2 wherein, in a region of the sealing element, the sealing head has at least one annular peripheral groove in which a sealing ring can be accommodated.

5. The flow cell assembly according to claim 2, wherein the at least one sealing element has an elastic or liquid sealing material.

6. The flow cell assembly according to claim 1, wherein a connection diameter $d_{con}$ of the sealing head of the connecting piece is larger than an outer diameter $d_{out}$ of a sealing neck of the connecting piece.

7. The flow cell assembly according to claim 6, wherein the outer diameter $d_{out}$ of the sealing neck of the connecting piece is smaller than a flow cell outer diameter $d_{fout}$ of the flow cell.

8. The flow cell assembly according to claim 1 wherein, in a region outside the flow cell, the connecting piece has an opening having a receiving diameter $d_{rec}$ for receiving a flow line.

9. The flow cell assembly according to claim 8 wherein, in a region within the flow cell, the sealing head of the connecting piece has an opening having a transfer diameter $d_{tran}$ for transferring the liquid NMR sample.

10. The flow cell assembly according to claim 9, wherein to the receiving diameter $d_{rec}$ and the transfer diameter $d_{tran}$, the following applies: $d_{tran} < d_{rec}$.

11. The flow cell assembly according to claim 1, wherein an inner line diameter $d_{lid}$ of a connecting line in the sealing head of the connecting piece is greater than an outer line diameter $d_{old}$ of the connecting line.

12. The flow cell assembly according to claim 1, wherein the flow cell assembly is designed for an internal pressure of at least 10 bar.

13. An NMR spectrometer for measuring NMR samples, comprising:
    a flow cell assembly according to claim 1;
    a magnet bore in an NMR magnet arrangement; and
    a sample holder within the magnet bore for reversible insertion of the flow cell assembly.

14. The NMR spectrometer according to claim 13, wherein the NMR magnetic field ($B_0$) generated by the NMR magnet arrangement runs transversely to an axis ($A_m$) of the magnet bore.

* * * * *

UNITED STATES PATENT AND TRADEMARK OFFICE
CERTIFICATE OF CORRECTION

| | | |
|---|---|---|
| PATENT NO. | : 11,796,444 B2 | |
| APPLICATION NO. | : 17/895831 | |
| DATED | : October 24, 2023 | |
| INVENTOR(S) | : Roger Meister and Martin Woodtli | |

It is certified that error appears in the above-identified patent and that said Letters Patent is hereby corrected as shown below:

On the Title Page

Item (30) Foreign Application Priority Data:
Delete "10202120973.8" and insert --102021209738--

Signed and Sealed this
Twenty-third Day of January, 2024

Katherine Kelly Vidal
*Director of the United States Patent and Trademark Office*